(12) United States Patent
Lee et al.

(10) Patent No.: US 8,415,683 B2
(45) Date of Patent: Apr. 9, 2013

(54) LIGHT EMITTING DIODE CHIP

(75) Inventors: Chia-En Lee, Chiayi (TW); Cheng-Ta Kuo, Hsinchu (TW); Der-Ling Hsia, Taoyuan County (TW)

(73) Assignee: Lextar Electronics Corp., Hsinchu (TW)

( * ) Notice: Subject to any disclaimer, the term of this patent is extended or adjusted under 35 U.S.C. 154(b) by 379 days.

(21) Appl. No.: 12/464,859

(22) Filed: May 12, 2009

(65) Prior Publication Data
US 2010/0258818 A1 Oct. 14, 2010

(30) Foreign Application Priority Data
Apr. 9, 2009 (TW) .............................. 98111843 A

(51) Int. Cl.
*H01L 27/15* (2006.01)
(52) U.S. Cl.
USPC ............... 257/79; 257/E21.599; 257/E33.056
(58) Field of Classification Search ............... 257/79; 438/26
See application file for complete search history.

(56) References Cited

U.S. PATENT DOCUMENTS

| 7,250,638 | B2 | 7/2007 | Lee et al. | |
|---|---|---|---|---|
| 2006/0065901 | A1* | 3/2006 | Aoyagi et al. | 257/79 |
| 2006/0091409 | A1* | 5/2006 | Epler et al. | 257/95 |
| 2008/0023691 | A1* | 1/2008 | Jang et al. | 257/13 |
| 2008/0315220 | A1* | 12/2008 | Lee et al. | 257/94 |
| 2009/0026490 | A1* | 1/2009 | Kim et al. | 257/103 |
| 2009/0029499 | A1* | 1/2009 | Nakahara | 438/46 |
| 2009/0039371 | A1* | 2/2009 | Kim et al. | 257/98 |
| 2010/0320488 | A1* | 12/2010 | Horie | 257/91 |

* cited by examiner

*Primary Examiner* — A. Sefer
(74) *Attorney, Agent, or Firm* — Liu & Liu

(57) ABSTRACT

The present invention provides a manufacturing method of an LED chip. First, a device layer is formed on a growth substrate, wherein the device layer has a first surface connected to the growth substrate and a second surface. Next, a plurality of first trenches are formed on the second surface of the device layer. Then, a protection layer is formed on the side walls of the first trenches. After that, the second surface is bonded with a supporting substrate and the device layer is then separated from the growth substrate. Further, a plurality of second trenches corresponding to the first trenches are formed in the device layer to form a plurality of LEDs, wherein the second trenches extend from the first surface to the bottom portions of the first trenches. Furthermore, a plurality of electrodes are formed on the first surface of the device layer.

24 Claims, 14 Drawing Sheets

LIGHT EMITTING DIODE CHIP

CROSS-REFERENCE TO RELATED APPLICATION

This application claims the priority benefit of Taiwan application serial no. 98111843, filed Apr. 9, 2009. The entirety of the above-mentioned patent application is hereby incorporated by reference herein and made a part of specification.

BACKGROUND OF THE INVENTION

1. Field of the Invention

The present invention generally relates to a light emitting diode chip (LED chip) and a manufacturing method thereof, and more particularly, to an LED chip with good reliability and a manufacturing method thereof.

2. Description of Related Art

Due to advantages of long lifetime, small volume, high shock absorption, low heat and power saving, LEDs have been widely used in household appliances and indicators or light sources of various instruments. In recent years, LEDs are developing towards rich colorfulness and high luminance, so that the applications of LEDs have been expanded to mega-size display board, traffic light, and so on. It can be expected LEDs can substitute tungsten lamps and mercury lamps in future and become lighting sources with electricity-saving and environmental friendly functions.

In the prior art, LEDs can be fabricated through forming a gallium nitride (GaN) epitaxy layer on a sapphire substrate. The method is suitable to fabricate GaN LEDs on sapphire substrates by using semiconductor process. The disadvantage of the above-mentioned method is that the fabricated GaN LEDs are located on a sapphire substrate, which limits the insulation and heat-dissipating efficiency of the GaN LEDs.

To solve the above-mentioned problem, U.S. Pat. No. 7,250,638 provides a vertical type GaN LED. To fabricate the vertical type GaN LED, a wafer level bonding process and a laser lift-off process are used to separate the formed GaN epitaxy layer from the sapphire substrate. Then, the GaN epitaxy layer is placed on a permanent substrate with good electric conductivity and thermal conductivity. Ultimately, electrodes are fabricated so as to form an LED chip. In U.S. Pat. No. 7,250,638, the GaN epitaxy layer is patterned to form a plurality of LEDs separated from each other, and then a protection layer is formed on the side wall of the patterned GaN epitaxy layer. Afterward, the above-mentioned wafer level bonding process and laser lift-off process are performed.

FIG. 1A is a cross-sectional view of a conventional LED chip during a wafer bonding process and FIG. 1B is a cross-sectional view of a conventional LED chip during a laser lift-off process. Referring to FIG. 1A, an LED chip 100 formed on a growth substrate S1 includes a GaN epitaxy layer 110, a bonding layer 120 and a protection layer 130, wherein the bonding layer 120 is disposed on the GaN epitaxy layer 110, and the protection layer 130 covers a part of the bonding layer 120 and the side walls of the GaN epitaxy layer 110. In more details, the protection layer 130 extends along the side walls of the GaN epitaxy layer 110 and reaches the growth substrate S1. In addition, the GaN epitaxy layer 110 is bonded with a supporting substrate S2 through the bonding layer 120, so that the LED chip 100 is located between the growth substrate S1 and the supporting substrate S2.

Referring to FIG. 1B, a laser lift-off process is performed, wherein laser L irradiates the interface between the GaN epitaxy layer 110 and the growth substrate S1 during the laser lift-off process. At this time, the GaN material at the boundary between the GaN epitaxy layer 110 and the growth substrate S1 is vaporized into gas-phase gallium (Ga) and nitrogen gas ($N_2$) such that the GaN epitaxy layer 110 is separated from the growth substrate S1. However, when the laser L irradiates the interface between the GaN epitaxy layer 110 and the growth substrate S1, a quite large barometric pressure is produced by the above-mentioned gases between the GaN epitaxy layer 110 and the growth substrate S1. The gases with high pressure cause peeling of the protection layer 130 formed on the side walls of the GaN epitaxy layer 110, which results in poor reliability.

SUMMARY OF THE INVENTION

Accordingly, the present invention is directed to an LED chip having good reliability and a manufacturing method thereof.

The present invention provides a manufacturing method of an LED chip. First, a device layer is formed on a growth substrate, wherein the device layer has a first surface connected to the growth substrate and a second surface. Next, a plurality of first trenches are formed on the second surface of the device layer, wherein the depth of each of the first trenches is less than the thickness of the device layer. Then, a protection layer is formed on the side walls of the first trenches. After that, the second surface of the device layer is bonded with a supporting substrate and the device layer is separated from the growth substrate. Further, a plurality of second trenches corresponding to the first trenches are formed in the device layer so as to form a plurality of LEDs separated from each other, wherein the second trenches extend from the first surface to the bottom portions of the first trenches. Furthermore, a plurality of electrodes are formed on the first surface of the device layer, wherein each of the electrodes is respectively electrically connected to a corresponding one of the LEDs separated from each other.

In an embodiment of the present invention, the method of forming the device layer includes forming a semiconductor stacked layer on the growth substrate and forming a bonding layer on the semiconductor stacked layer.

In an embodiment of the present invention, the method of forming the semiconductor stacked layer includes forming a first-type doped semiconductor layer on the growth substrate, forming a light-emitting layer on the first-type doped semiconductor layer and forming a second-type doped semiconductor layer on the light-emitting layer.

In an embodiment of the present invention, the method of forming the bonding layer includes forming a conductive layer on the semiconductor stacked layer, wherein the supporting substrate is a conductive substrate bonded with the conductive layer.

In an embodiment of the present invention, the method of forming the first trenches includes removing a part of the bonding layer and the semiconductor stacked layer.

In an embodiment of the present invention, the width of each of the first trenches is greater than the width of each of the second trenches.

In an embodiment of the present invention, the method of separating the device layer from the growth substrate includes conducting a laser lift-off process.

In an embodiment of the present invention, the above-mentioned manufacturing method of an LED chip further includes roughening the surfaces of the LEDs.

In an embodiment of the present invention, the above-mentioned manufacturing method of an LED chip further includes cutting the supporting substrate so as to singularize the LEDs.

In an embodiment of the present invention, the plurality of second trenches are formed after separating the device layer from the growth substrate.

In an embodiment of the present invention, the plurality of second trenches are formed before bonding the device layer with the supporting substrate.

The present invention provides an LED chip including a supporting substrate, an LED, a protection layer and an electrode. The LED is disposed on the supporting substrate, wherein the LED has a bottom surface connected to the supporting substrate, a top surface and a side surface connected between the bottom surface and the top surface, and the area of the top surface is greater than the area of the bottom surface. The protection layer covers a part of the side surface adjacent to the supporting substrate only. The electrode is disposed on the top surface of the LED.

In an embodiment of the present invention, the LED includes a semiconductor stacked layer and a bonding layer disposed between the supporting substrate and the semiconductor stacked layer.

In an embodiment of the present invention, the semiconductor stacked layer includes a second-type doped semiconductor layer, a light-emitting layer and a first-type doped semiconductor layer, wherein the second-type doped semiconductor layer is disposed on the bonding layer, the light-emitting layer is disposed on the second-type doped semiconductor layer and the first-type doped semiconductor layer is disposed on the light-emitting layer.

In an embodiment of the present invention, the bonding layer is a conductive layer.

In an embodiment of the present invention, the side surface of the LED is a side surface with step profile.

In an embodiment of the present invention, the LED includes a first portion and a second portion, wherein the first portion is disposed on the supporting substrate and the second portion is disposed on the first portion, wherein the sectional area of the first portion is smaller than the sectional area of the second portion.

In an embodiment of the present invention, the protection layer covers the side surface of the first portion only.

In an embodiment of the present invention, parts of the top surface not covered by the protection layer is a rough surface.

In an embodiment of the present invention, parts of the side surface not covered by the protection layer is a rough surface.

In an embodiment of the present invention, the supporting substrate includes a conductive substrate.

Based on the description above, in the LED chip of the present invention, the protection layer is unlikely peeled. Consequently, the LED chip of the present invention has good reliability.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 3A-3I are cross-sectional views showing a manufacturing method of an LED chip according to the second embodiment of the present invention.

DESCRIPTION OF THE EMBODIMENTS

Figure 1A:
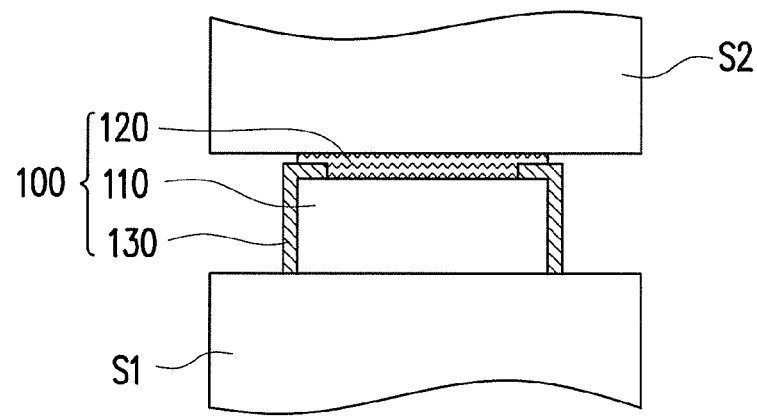
FIG. 1A is a cross-sectional view of a conventional LED chip during a wafer bonding process.
Figure 1B:
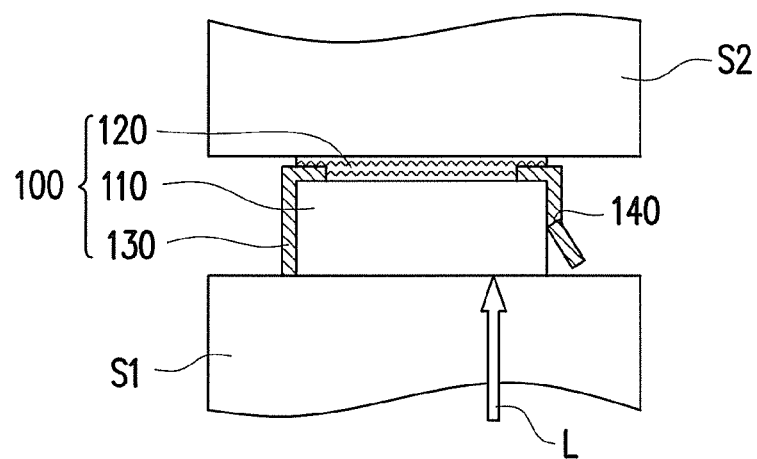
FIG. 1B is a cross-sectional view of a conventional LED chip during a laser lift-off process.

Reference will now be made in detail to the present preferred embodiments of the invention, examples of which are illustrated in the accompanying drawings. Wherever possible, the same reference numbers are used in the drawings and the description to refer to the same or like parts.

The First Embodiment

FIGS. 2A-2I are cross-sectional views showing a manufacturing method of an LED chip according to the first embodiment of the present invention.

Figure 2A:
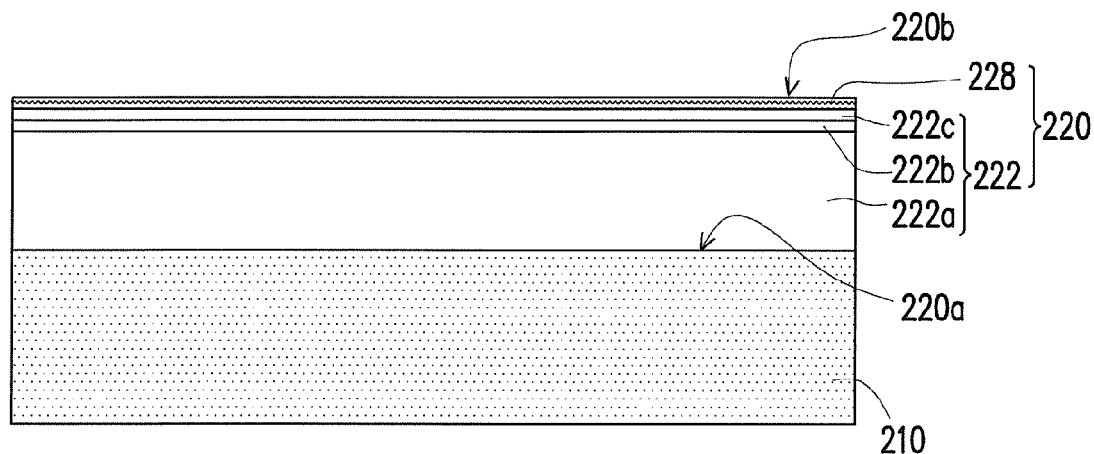
FIGS. 2A-2I are cross-sectional views showing a manufacturing method of an LED chip according to the first embodiment of the present invention.

Referring to FIG. 2A, a device layer 220 is formed on a growth substrate 210 first, wherein the device layer 220 has a first surface 220a connected to the growth substrate 210 and a second surface 220b. In the embodiment, the growth substrate 210 is, for example, a sapphire substrate. The method of forming the device layer 220 is, for example, forming a semiconductor stacked layer 222 on the growth substrate 210 and forming a bonding layer 228 on the semiconductor stacked layer 222. It is noted that the method of forming the semiconductor stacked layer 222 is, for example, forming a first-type doped semiconductor layer 222a first on the growth substrate 210. Then, a light-emitting layer 222b is formed on the first-type doped semiconductor layer 222a and a second-type doped semiconductor layer 222c is formed on the light-emitting layer 222b. In the embodiment, the bonding layer 228 is, for example, a conductive layer and the material of the conductive layer is, for example, metal.

Figure 2B:
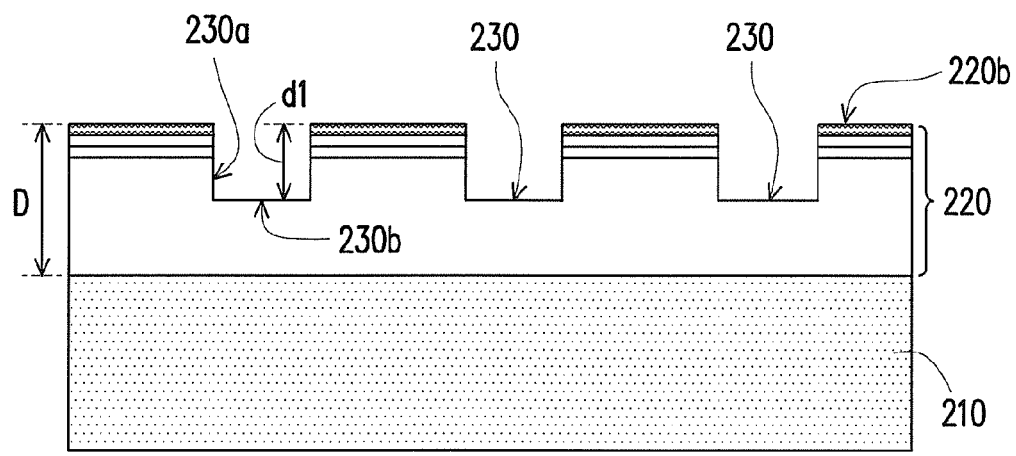

Referring to FIG. 2B, a plurality of first trenches 230 are formed on the second surface 220b of the device layer 220. The first trenches 230 is, for example, formed by conducting a photolithography etching process (PEP) to remove a part of the bonding layer 228 and the semiconductor stacked layer 222. It should be noted that the depth d1 of each of the above-mentioned first trenches 230 is less than the thickness D of the device layer 220.

Figure 2C:
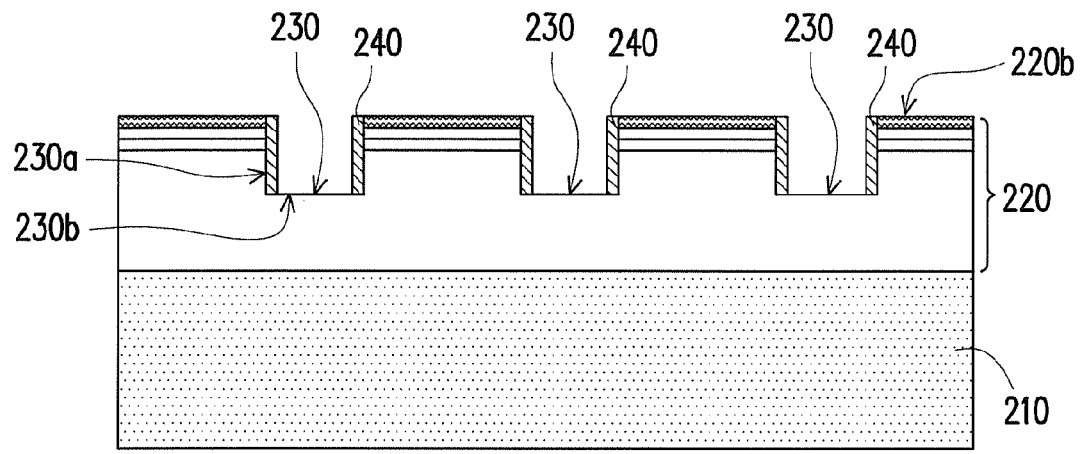

Referring to FIG. 2C, a protection layer 240 is formed on the side walls 230a of the first trenches 230. In the embodiment, the protection layer 240 is formed by conducting a photolithography etching process. As shown in FIG. 2C, since the depth d1 of each of the first trenches 230 is less than the thickness D of the device layer 220, the protection layer 240 formed on the side walls 230a is not in contact with the growth substrate 210. In fact, the protection layer 240 extends from the side walls 230a of the first trenches 230 to the bottom portion 230b and is in contact with the bottom portion 230b.

Figure 2D:
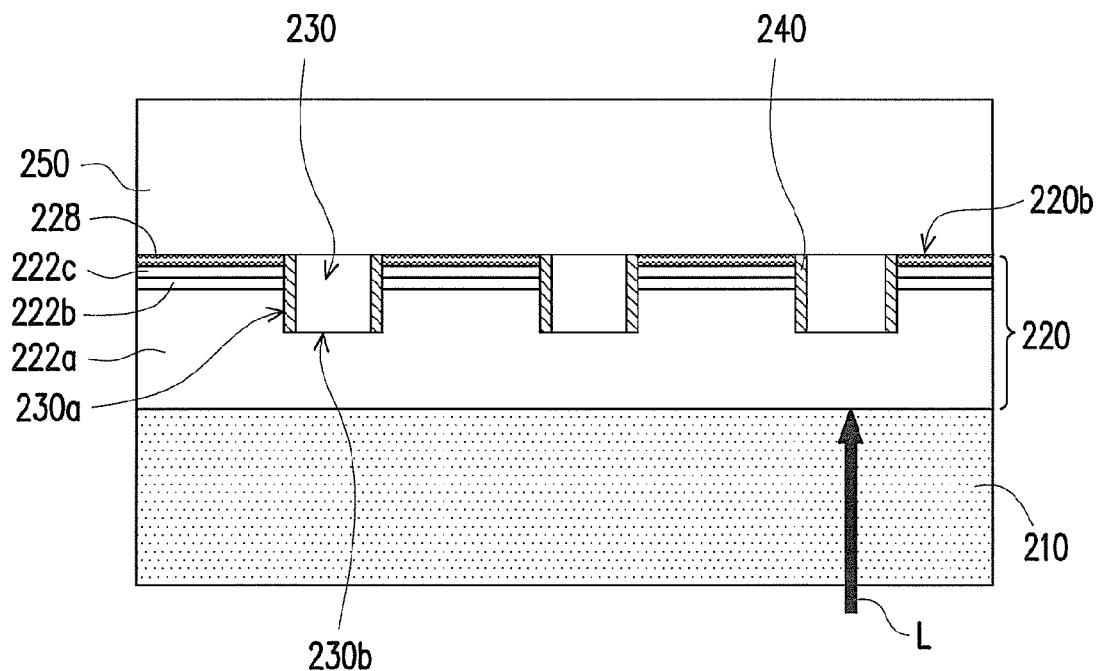

Referring to FIG. 2D, after forming the protection layer 240, the second surface 220b of the device layer 220 is then bonded with a supporting substrate 250. In the embodiment, the supporting substrate 250 is, for example, a conductive substrate suitable to be bonded with the bonding layer 228 and the conductive substrate can be a metal substrate. Both the bonding layer 228 and the supporting substrate 250 are conductive, so that the device layer 220 is electrically connected to the supporting substrate 250 through the bonding layer 228. Besides, in comparison with the growth substrate 210, the supporting substrate 250 usually has better heat dissipation performance.

Figure 2E:
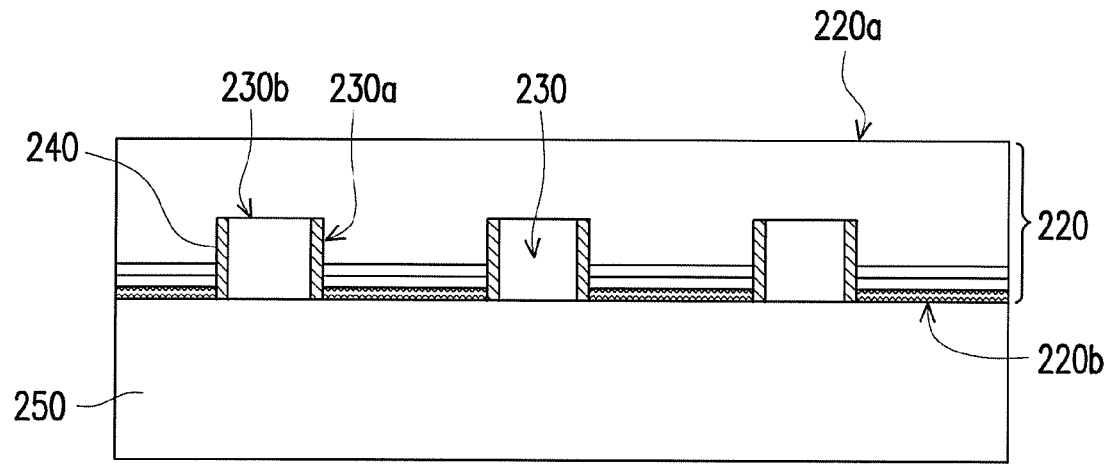

Referring to FIG. 2E, after bonding the device layer 220 with the supporting substrate 250, a process is used to separate the device layer 220 from the growth substrate 210. In the embodiment, the method of separating the device layer 220 from the growth substrate 210 is, for example, to perform a laser lift-off process. More specifically, laser L is used to irradiate the interface between the device layer 220 and the growth substrate 210 (as shown in FIG. 2D) so as to separate the device layer 220 from the growth substrate 210 (as shown in FIG. 2E). In the embodiment, the protection layer 240 does not directly contact the growth substrate 210, so that during separating the device layer 220 from the growth substrate 210, the protection layer 240 is unlikely affected by a barometric pressure and peeling phenomena can be thereby avoided.

Figure 2F:
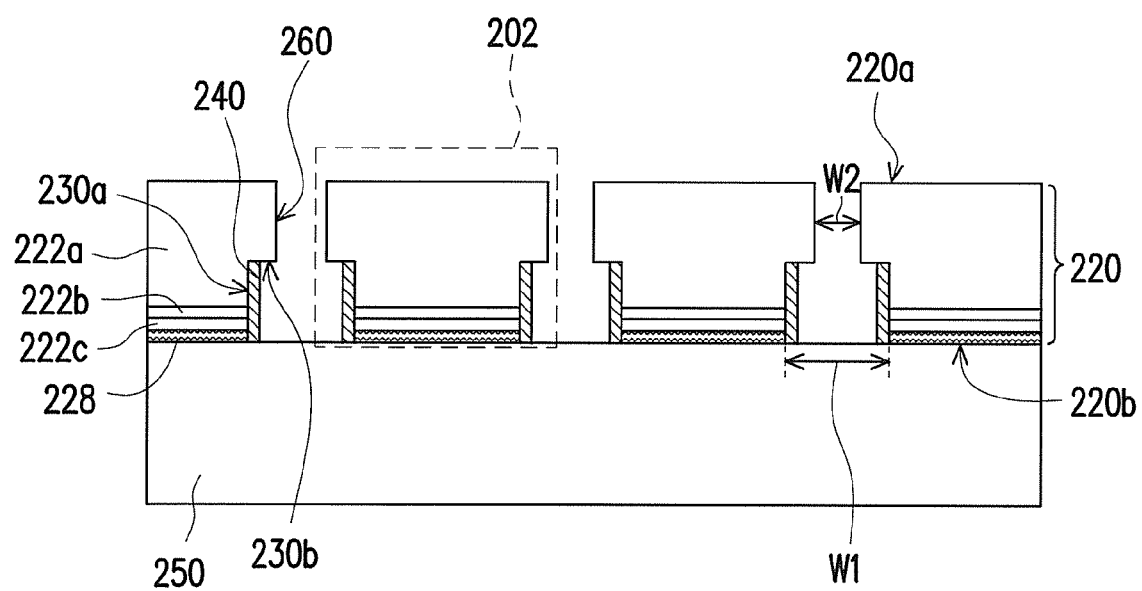

Referring to FIG. 2F, a plurality of second trenches 260 corresponding to the above-mentioned first trenches 230 are formed in the device layer 220 so as to form a plurality of LEDs 202 separated from each other. The second trenches 260 extend from the first surface 220a to the bottom portions 230b of the first trenches 230. It should be noted that the width W1 of each of the first trenches 230 is greater than the width W2 of each of the second trenches 260. The width of the first trenches 230 and the second trenches 260 is not limited in the present invention. In other embodiments, the width W1 of each of the first trenches 230 is less than the width W2 of each of the second trenches 260. The depth of the first trenches 230 and the depth of the second trenches 260 (not shown) can be determined depending on the actual requirement. In comparison with the FIGS. 2A-2D, the device layer 220 in FIGS. 2E-2G is shown upside down; thus, the bottom portions 230b of the first trenches 230 appear at an upper location in FIGS. 2E-2G.

Figure 2G:
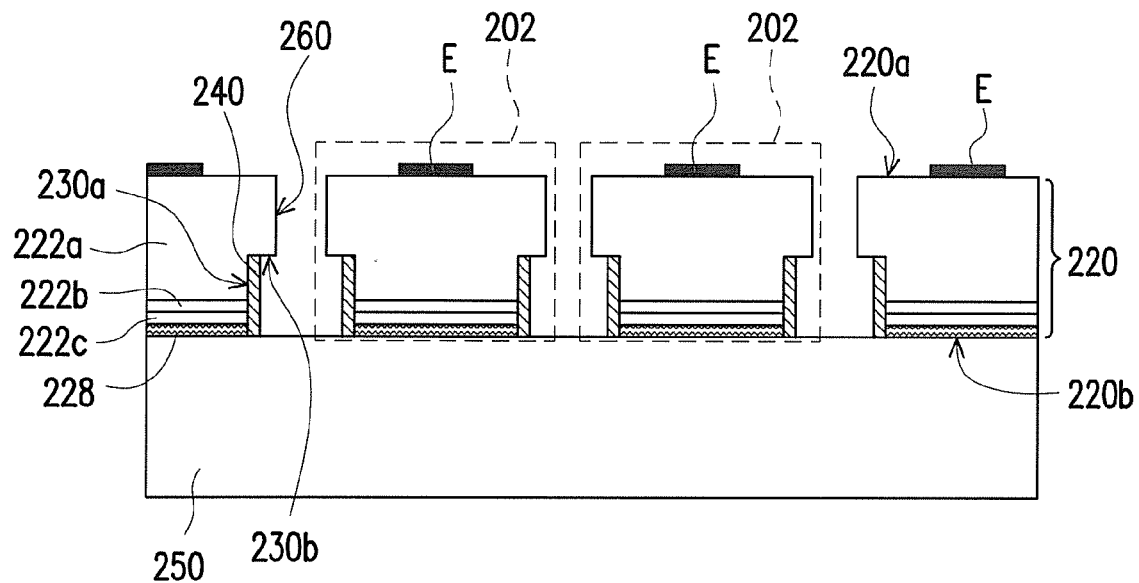

Referring to FIG. 2G, a plurality of electrodes E are formed on the first surface 220a of the device layer 220, wherein each of the electrodes E is electrically connected to a corresponding one of the plurality of LEDs 202 respectively. In this embodiment, an ohmic contact is formed between each of the electrodes E and a corresponding LED 202.

Figure 2H:
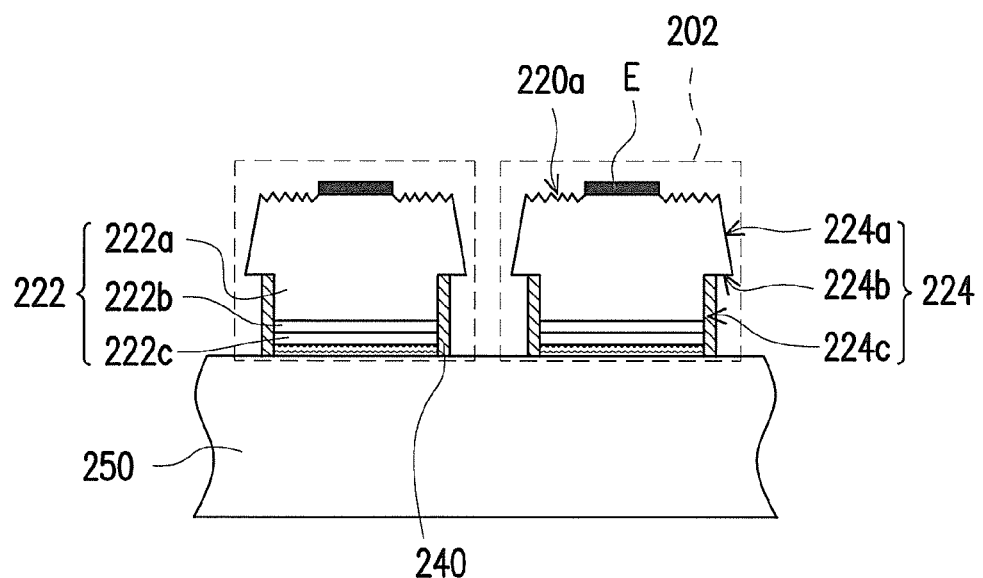

Referring to FIG. 2H, for simplicity, only two LEDs 202 are shown in FIG. 2H. In the embodiment, a process is performed to roughen the surfaces of the LEDs 202, which is helpful to increase the light-extraction efficiency of the LEDs 202.

Figure 2I:
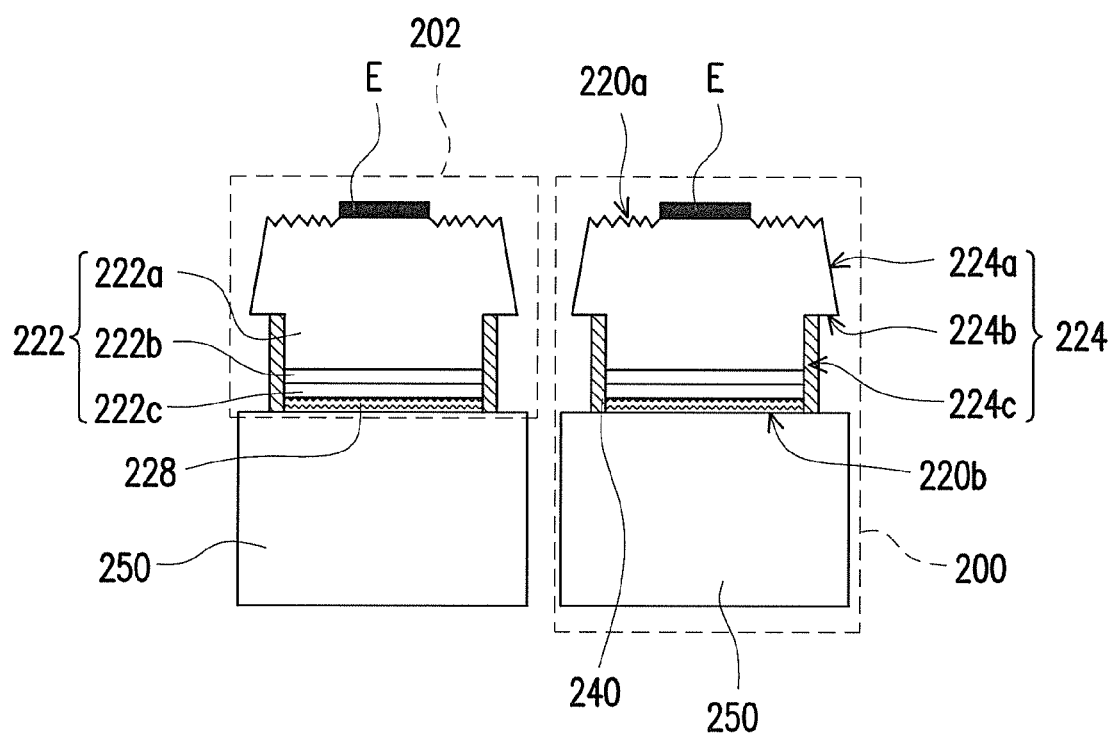

In the embodiment, the above-mentioned manufacturing method of an LED chip can further include cutting the supporting substrate 250 to singularize the LEDs 202, as shown in FIG. 2I. In the embodiment, an LED chip 200 includes one LED 202 only, which means after cutting the supporting substrate 250, only one LED 202 is disposed on a small supporting substrate 250. However, the number of the LED 202 disposed on the supporting substrate 250 is not limited by the present invention. In an alternative embodiment of the present invention, a plurality of LEDs 202 can be formed on a single smaller supporting substrate 250.

The Second Embodiment

In the first embodiment, the plurality of second trenches 260 are formed after separating the device layer 220 from the growth substrate 210, while in the second embodiment, the plurality of second trenches 260 are formed before bonding the device layer 220.

FIGS. 3A-3I are cross-sectional views showing a manufacturing method of an LED chip according to the second embodiment of the present invention.

Figure 3A:
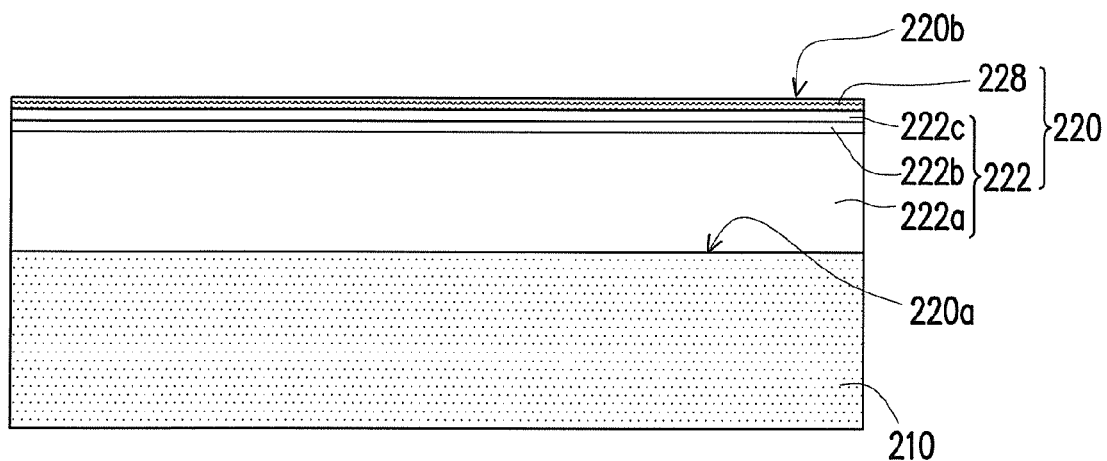
Figure 3B:
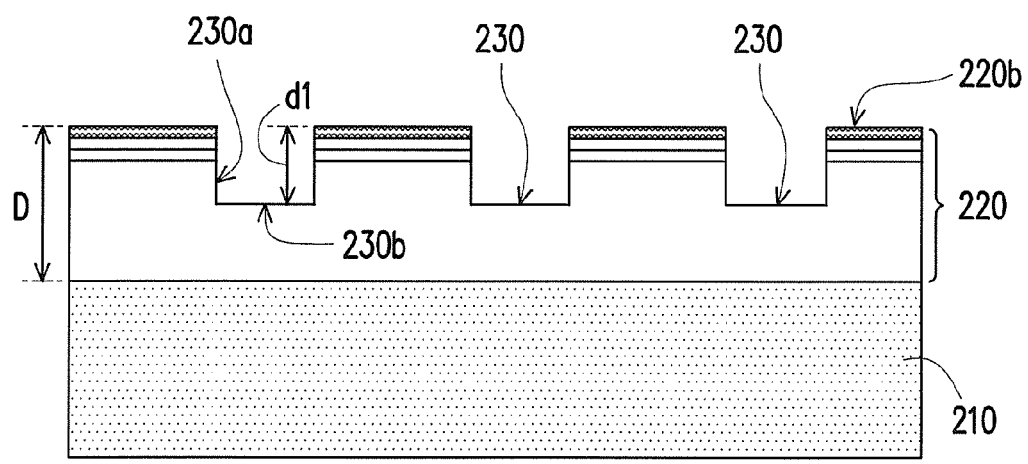
Figure 3C:
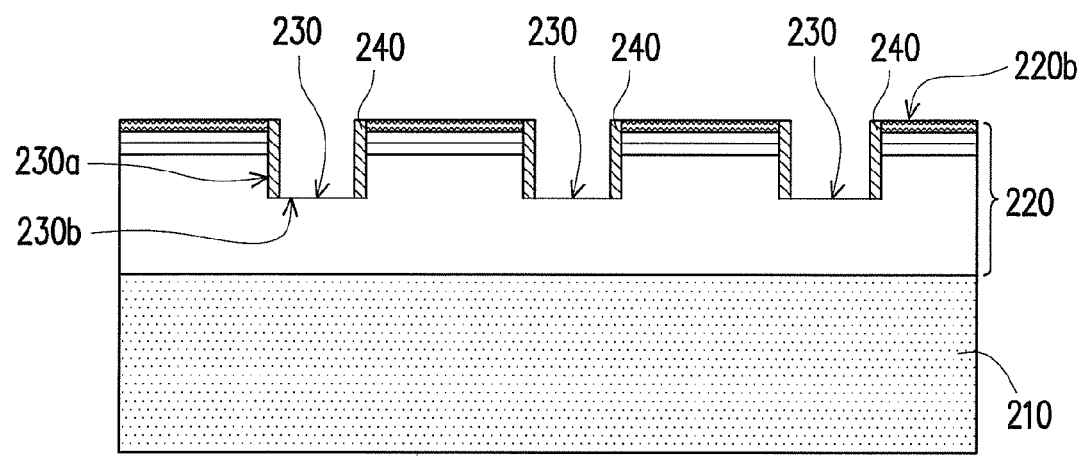

First, the manufacturing method of the embodiment is conducted following the sequential steps as shown by FIGS. 3A-3C. Since the steps of FIGS. 3A-3C are substantially the same as that of FIGS. 2A-2C of the first embodiment, the detail descriptions are omitted.

Figure 3D:
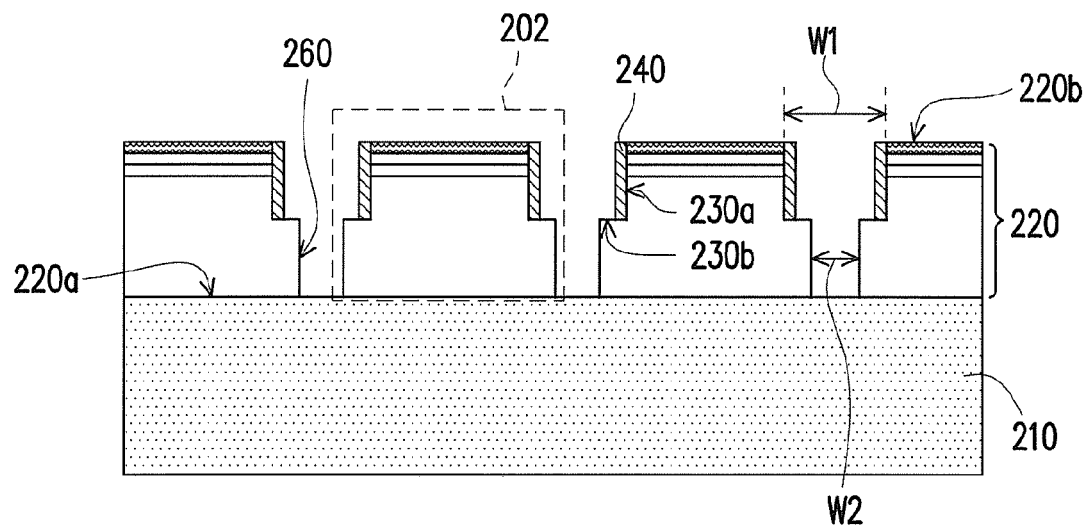

Referring to FIGS. 3C and 3D, the second embodiment is similar with the first embodiment except that after forming the protection layer 240 on the side walls 230a of the first trenches 230, a plurality of second trenches 260 corresponding to the above-mentioned first trenches 230 are formed directly in the device layer 220 so as to form a plurality of LEDs 202 separated from each other. The second trenches 260 extend from the first surface 220a to the bottom portions 230b of the first trenches 230. It should be noted that, similarly to the first embodiment, the width W1 of each of the first trenches 230 is greater than the width W2 of each of the second trenches 260. In addition, the depth of the first trenches 230 and the depth of the second trenches 260 (not shown) can be determined depending on the actual requirement.

Figure 3E:
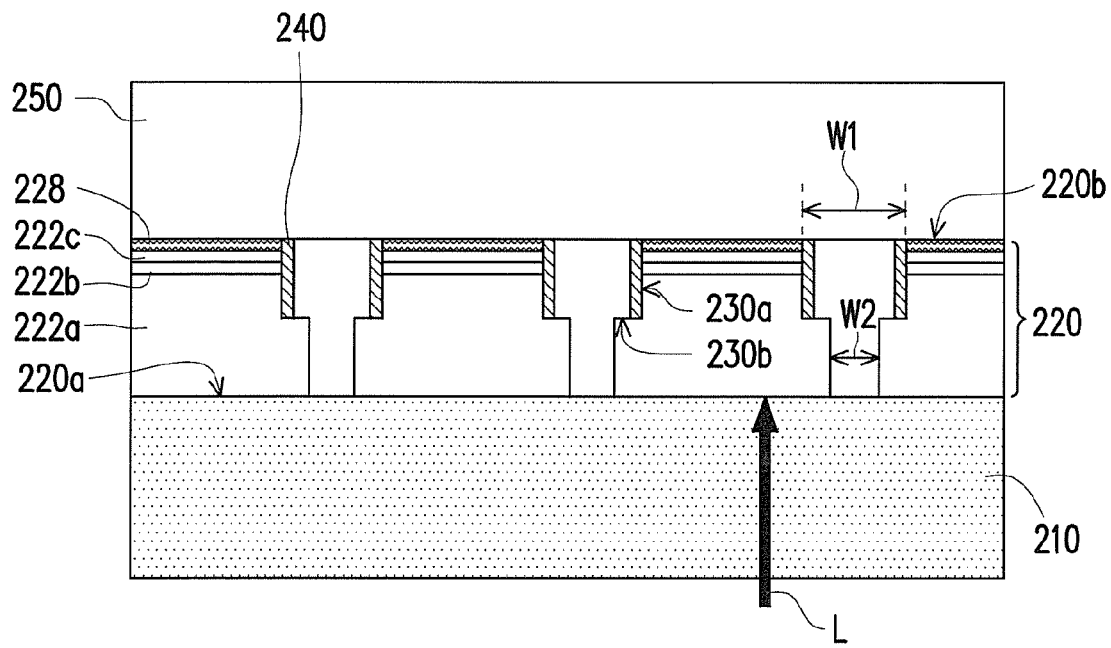
Figure 3F:
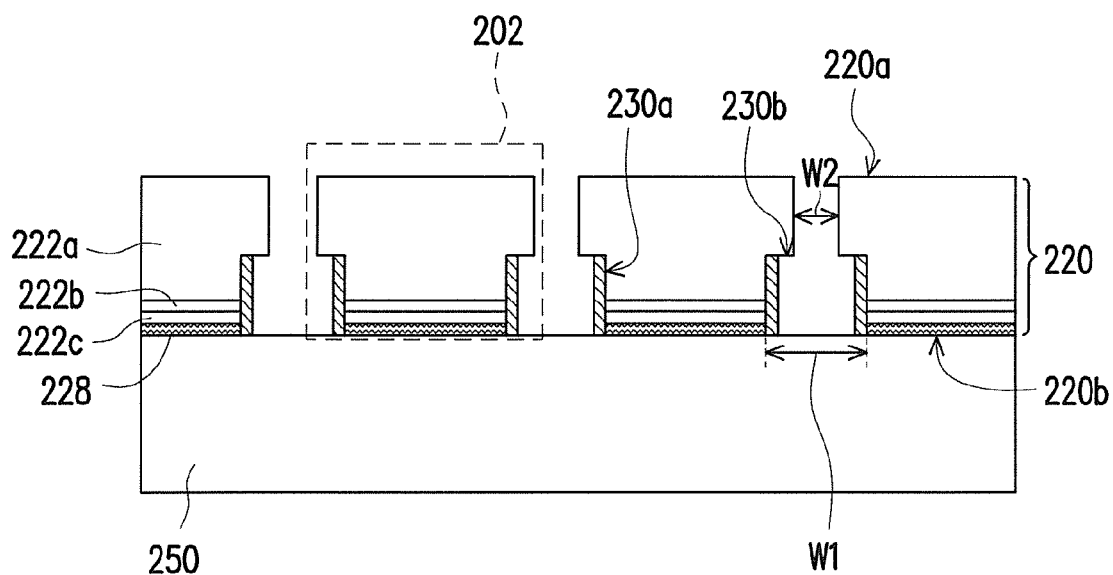

Referring to FIG. 3E, after forming the second trenches 260, the second surface 220b of the device layer 220 is bonded with the supporting substrate 250. Similarly to the first embodiment, the supporting substrate 250 of the second embodiment is a conductive substrate suitable to be bonded with the bonding layer 228 and the conductive substrate may be a metal substrate. Both the bonding layer 228 and the supporting substrate 250 are conductive, so that the device layer 220 is electrically connected to the supporting substrate 250 through the bonding layer 228. Besides, in comparison with the growth substrate 210, the supporting substrate 250 usually has better heat dissipation performance Referring to FIGS. 3E and 3F, in the embodiment, a laser lift-off process is used to separate the device layer 220 from the growth substrate 210. Similarly to the first embodiment, laser L is used to irradiate the interface between the device layer 220 and the growth substrate 210 (as shown in FIG. 3E) so as to separate the device layer 220 from the growth substrate 210 (as shown in FIG. 3F). In the embodiment, the protection layer 240 is not directly in contact with the growth substrate 210, so that during separating the device layer 220 from the growth substrate 210, the protection layer 240 is unlikely affected by a barometric pressure and peeling phenomena can be thereby avoided.

Figure 3G:
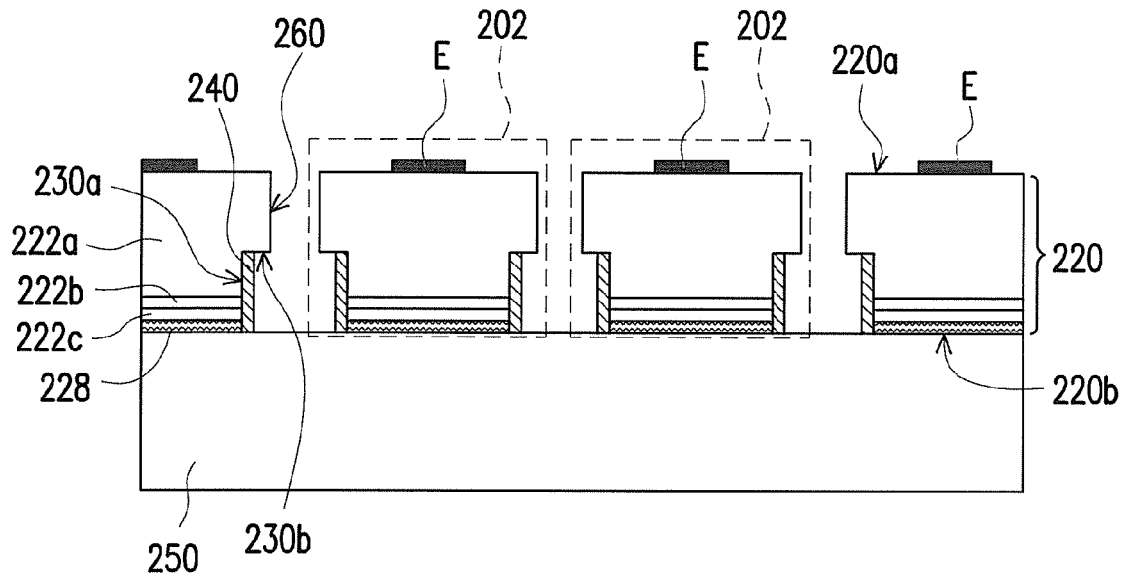
Figure 3H:
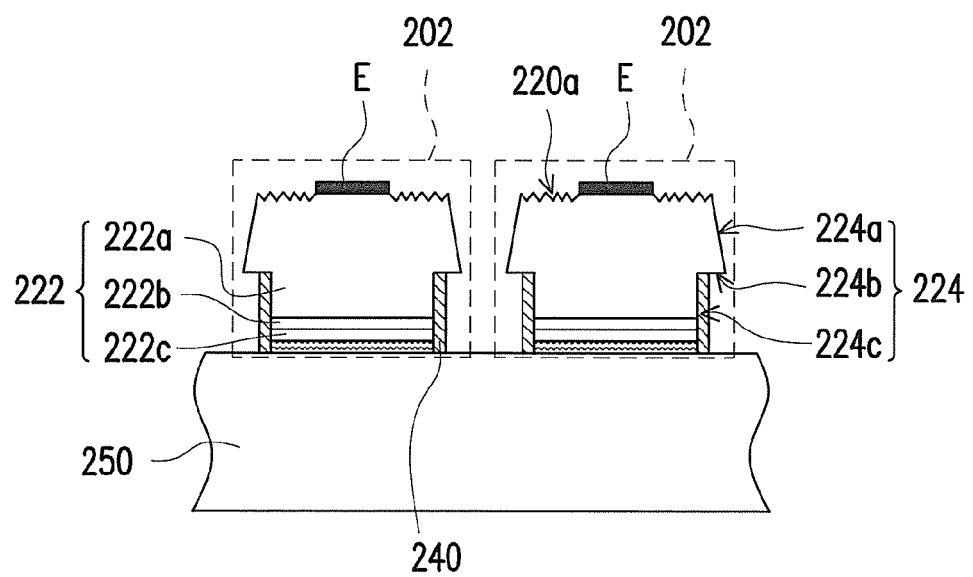
Figure 31:
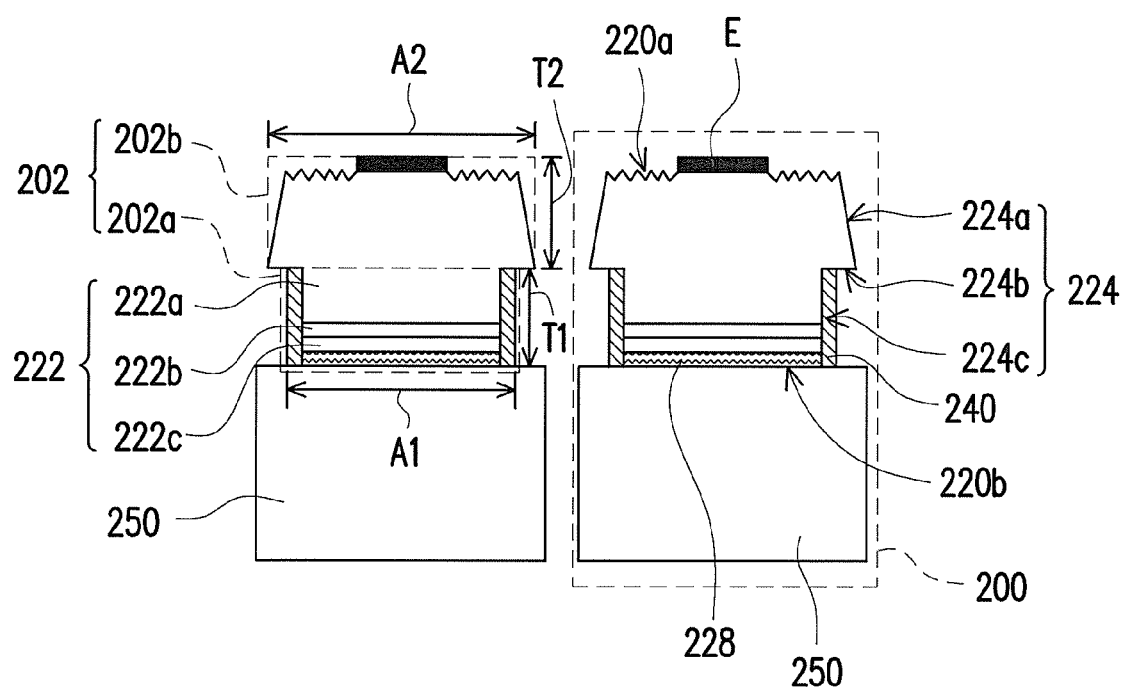

Referring to FIGS. 3G-3I, since the steps shown in FIGS. 3A-3I are substantially the same as that of FIGS. 2G-2I, the detail descriptions are omitted.

Referring to FIG. 3I, the LED chip 200 provided by the present invention can be fabricated by using the manufacturing method of the above-mentioned first embodiment or second embodiment, wherein the LED chip 200 includes a supporting substrate 250, an LED 202, a protection layer 240 and an electrodes E. The LED 202 is disposed on the supporting substrate 250, wherein the LED 202 has a bottom surface 220b connected to the supporting substrate 250, a top surface 220a and a side surface 224 connected between the top surface 220a and the bottom surface 220b. The area of the top surface 220a is greater than the area of the bottom surface 220b. The protection layer 240 covers a part of the side surface 224c adjacent to the supporting substrate 250 only. The electrode E is disposed on the top surface 220a of the LED 202.

In the above-mentioned LED chip 200, the LED 202 includes a semiconductor stacked layer 222 and a bonding layer 228, wherein the bonding layer 228 is disposed between the supporting substrate 250 and the semiconductor stacked layer 222. Additionally, the bonding layer 228 is, for example, a conductive layer. The supporting substrate 250 is, for example, a conductive substrate so that a current can be conducted through the supporting substrate 250 and the bonding layer 228 to enable the LED chip 200. It should be noted that in the above-mentioned LED chip 200, the side surface 224 of the LED 202 is a side surface with step profile.

Specifically, the semiconductor stacked layer 222 includes a second-type doped semiconductor layer 220c, a light-emitting layer 220b and a first-type doped semiconductor layer 220a, wherein the second-type doped semiconductor layer 220c is disposed on the bonding layer 228, the light-emitting layer 220b is disposed on the second-type doped semiconductor layer 220c and the first-type doped semiconductor layer 220a is disposed on the light-emitting layer 220b.

Figure 4:
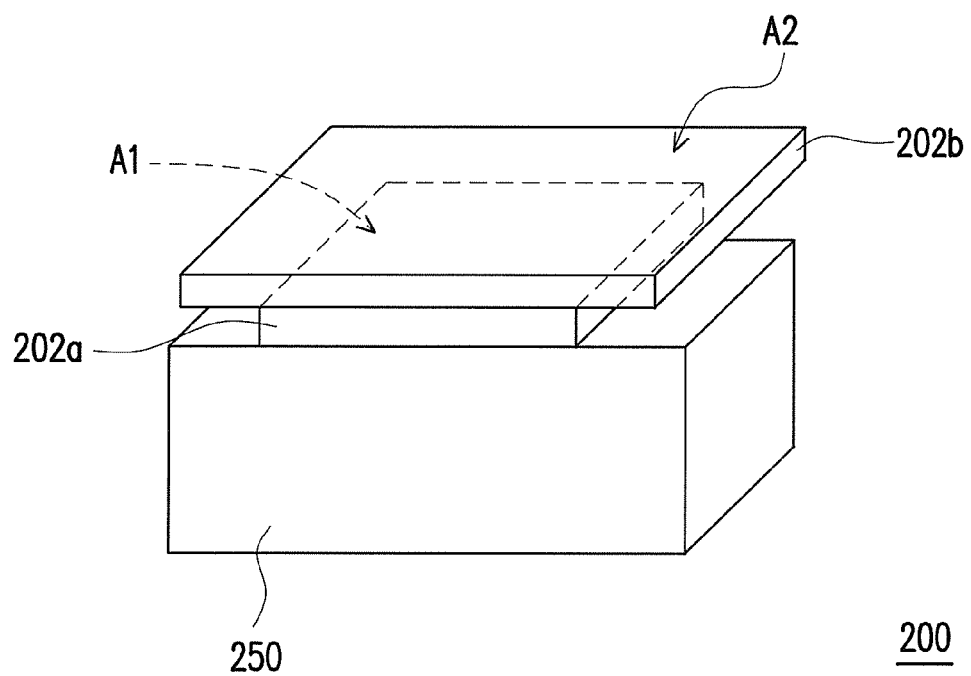
FIG. 4 is a perspective view of an LED chip according to an embodiment of the present invention.

FIG. 4 is a perspective view of an LED chip according to an embodiment of the present invention.

Referring to FIGS. 3I and 4, the LED 202 includes a first portion 202a and a second portion 202b, wherein the first portion 202a is disposed on the supporting substrate 250 and the second portion 202b is disposed on the first portion 202a. The sectional area A1 of the first portion 202a is smaller than the sectional area A2 of the second portion 202b. Besides, the protection layer 240 covers the side surface 224c of the first portion 202a only. It should be noted that in FIG. 4, the structure of the LED 202 is simplified for depiction convenience.

Figure 5:
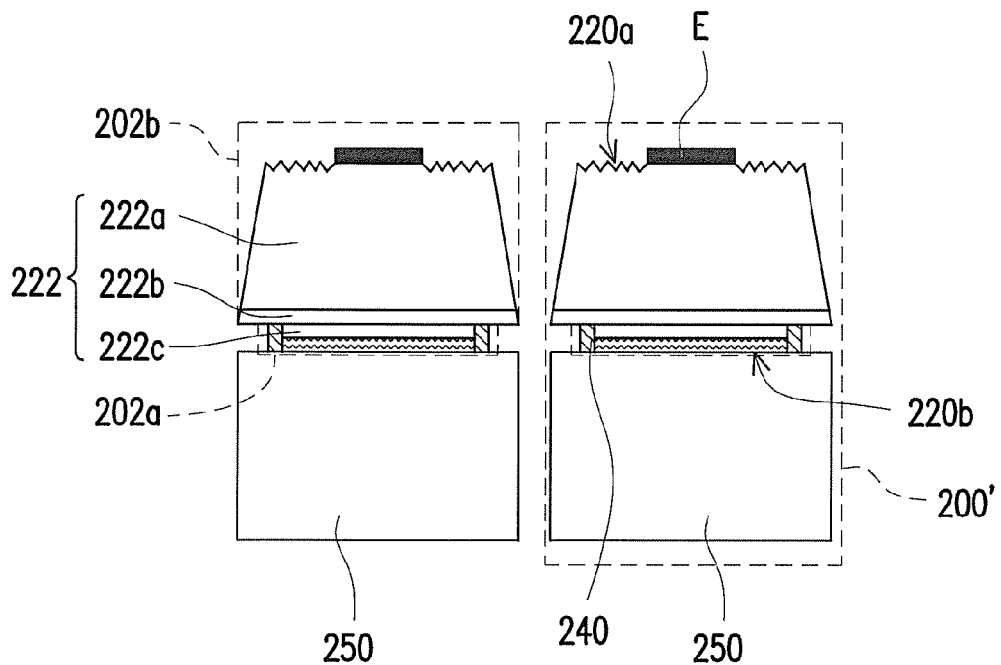
FIG. 5 is a cross-sectional view of an LED chip 200' according to an embodiment of the present invention.

In the above-mentioned LED chip 200, the light-emitting layer 220b is located in the first portion 202a. However, in the present invention, the light-emitting layer 220b is not limited to be located in the first portion 202a. In another embodiment of the present invention, the light-emitting layer 220b is located in the second portion 202b, as shown in FIG. 5, wherein the depth d1 of the first trenches 230 can be properly controlled so as to make the light-emitting layer 220b located in the second portion 202b.

Figure 6:
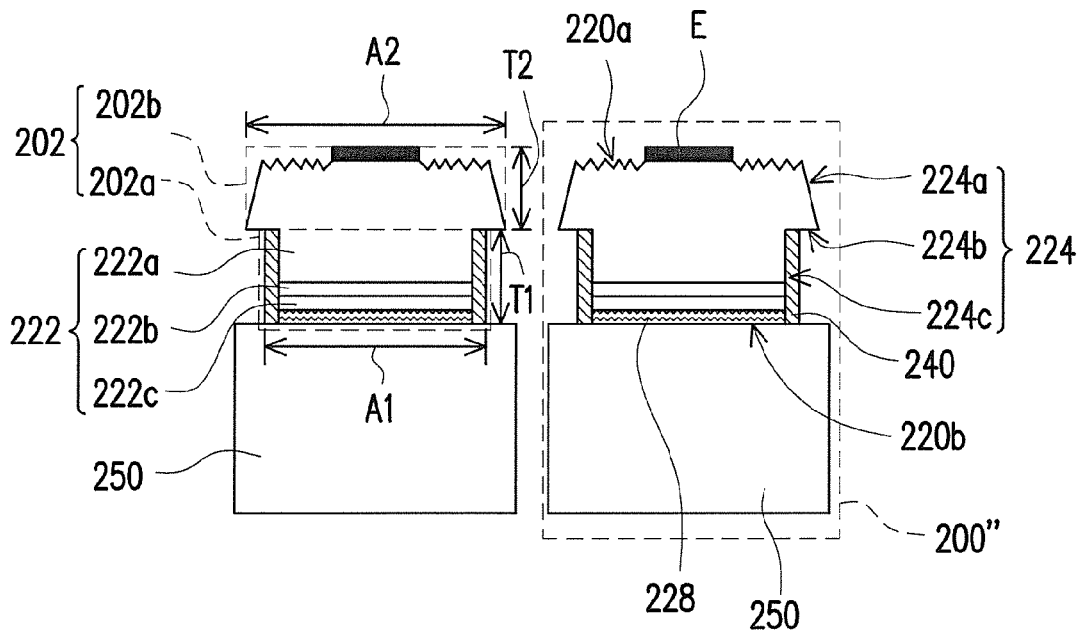
FIG. 6 is a cross-sectional view of an LED chip 200" according to an embodiment of the present invention.

Referring to FIG. 3I, in the above-mentioned LED chip 200, the thickness T1 of the first portion 202a is less than the thickness T2 of the second portion 202b. However, the thickness of the first portion 202a and the second portion 202b is not limited in the present invention. The thickness T1 of the first portion 202a and the thickness T2 of the second portion 202b can be determined to meet the actual requirement. For example, in an LED chip 200″ of another embodiment of the present invention, the thickness T1 of the first portion 202a is greater than the thickness T2 of the second portion 202b, as shown in FIG. 6.

Referring to FIG. 3I, in the above-mentioned LED chip 200, the top surface 220a not covered by the protection layer 240 is a rough surface, which is helpful to increase the light-extraction efficiency of the LED chip 200. In another embodiment of the present invention, the side surface 224a not covered by the protection layer 240 and a part of the side surface 224b may be roughened also.

Figure 7:
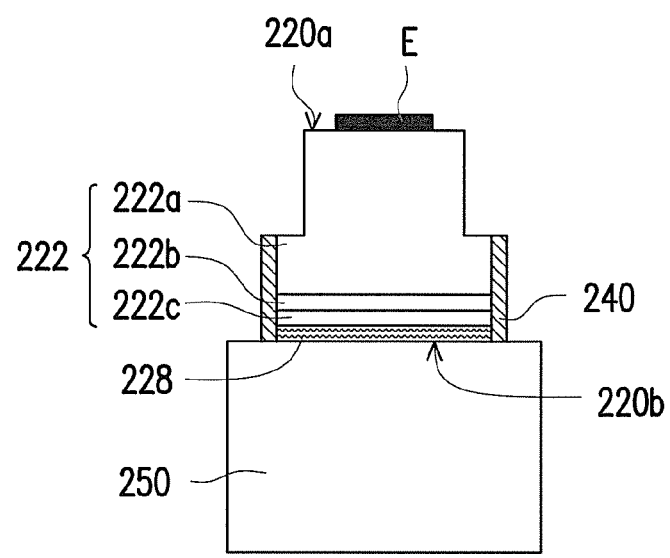
FIG. 7 is a cross-sectional view of an LED chip 300.

FIG. 7 is a cross-sectional view of an LED chip 300. The top surface of the LED chip of the present invention is not necessarily greater than the bottom surface. Referring to FIG. 7, in the LED chip 300, the area of the top surface 220a is less than the area of the bottom surface 220b thereof.

In summary, in the LED chip of the present invention, the protection layer does not directly contact the growth substrate, therefore, during separating the device layer from the growth substrate, the protection layer is unlikely peeled under the action of barometric pressure. Consequently, the LED chip of the present invention has good reliability.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A light emitting diode chip, comprising:
    a supporting substrate;
    a light emitting diode supported on the supporting substrate, wherein the light emitting diode has a bottom surface facing towards the supporting substrate, a top surface facing away from the supporting substrate, and a side surface extending between the bottom surface and the top surface, an area of the top surface is different from an area of the bottom surface, wherein the side surface of the light emitting diode includes a step profile along the side surface of the light emitting diode, wherein the light emitting diode further comprises:
        a first portion supported closer to the supporting substrate having a first sectional area; and
        a second portion having a second sectional area, wherein the first sectional area of the first portion is different from the second sectional area of the second portion, and wherein the step profile is a transition between the first portion and the second portion;
    a protection layer covering a portion of the side surface between the bottom surface and the top surface, wherein said portion is closer to the supporting substrate than the top surface and does not extend to the top surface, and wherein the protection layer does not extend to between the bottom surface and the supporting substrate; and
    an electrode disposed on the top surface of the light emitting diode.

2. The light emitting diode chip as claimed in claim 1, further comprising a bonding layer disposed between the supporting substrate and the bottom surface of the light emitting diode, wherein the protection layer extends to cover perimeter surface of the bonding layer.

3. The light emitting diode chip as claimed in claim 2, further comprising a semiconductor stacked layer, wherein the semiconductor stacked layer comprises:
    a second-type doped semiconductor layer disposed on the bonding layer;
    a light-emitting layer disposed on the second-type doped semiconductor layer; and
    a first-type doped semiconductor layer disposed on the light-emitting layer.

4. The light emitting diode chip as claimed in claim 2, wherein the bonding layer is a conductive layer.

5. The light emitting diode chip as claimed in claim 2, wherein the bonding layer directly contacts the supporting substrate.

6. The light emitting diode chip as claimed in claim 2, wherein the bonding layer directly contacts the bottom surface of the light emitting diode and the supporting substrate.

7. The light emitting diode chip as claimed in claim 1, wherein the protection layer covers side surface of the first portion and not side surface of the second portion.

8. The light emitting diode chip as claimed in claim 1, wherein the top surface is not covered by the protection layer, and the top surface includes a rough surface.

9. The light emitting diode chip as claimed in claim 1, wherein the supporting substrate comprises a conductive substrate.

10. The light emitting diode chip as claimed in claim 1, wherein the protection layer has an edge terminating at and directly contacting the supporting substrate.

11. The light emitting diode chip as claimed in claim 1, wherein the protection layer extends between the supporting substrate and the step profile.

12. The light emitting diode chip as claimed in claim 11, wherein the protection layer has an edge terminating at and directly contacting the supporting substrate and another edge terminating at the step profile.

13. A light emitting diode chip, comprising:
- a supporting substrate;
- a light emitting diode supported on the supporting substrate, wherein the light emitting diode has a bottom surface facing towards the supporting substrate, a top surface facing away from the supporting substrate, and a side surface extending between the bottom surface and the top surface, and wherein the side surface of the light emitting diode includes a step profile along the side surface of the light emitting diode;
- a protection layer covering a portion of the side surface between the bottom surface and the top surface, wherein said portion is closer to the supporting substrate than the top surface, wherein the protection layer extends between the supporting substrate and the step profile and does not extend to the top surface, and wherein the protection layer does not extend to between the bottom surface and the supporting substrate; and
- an electrode disposed on the top surface of the light emitting diode.

14. The light emitting diode chip as claimed in claim 13, further comprising a bonding layer disposed between the supporting substrate and the bottom surface of the light emitting diode, wherein the protection layer extends to cover perimeter surface of the bonding layer.

15. The light emitting diode chip as claimed in claim 14, further comprising a semiconductor stacked layer, wherein the semiconductor stacked layer comprises:
- a second-type doped semiconductor layer disposed on the bonding layer;
- a light-emitting layer disposed on the second-type doped semiconductor layer; and
- a first-type doped semiconductor layer disposed on the light-emitting layer.

16. The light emitting diode chip as claimed in claim 14, wherein the bonding layer is a conductive layer.

17. The light emitting diode chip as claimed in claim 14, wherein the bonding layer directly contacts the supporting substrate.

18. The light emitting diode chip as claimed in claim 14, wherein the bonding layer directly contacts the bottom surface of the light emitting diode and the supporting substrate.

19. The light emitting diode chip as claimed in claim 13, wherein the light emitting diode comprises:
- a first portion supported closer to the supporting substrate having a first sectional area; and
- a second portion having a second sectional area, wherein the first sectional area of the first portion is different from the second sectional area of the second portion, wherein the step profile is a transition between the first portion and the second portion.

20. The light emitting diode chip as claimed in claim 19, wherein the protection layer covers side surface of the first portion and not side surface of the second portion.

21. The light emitting diode chip as claimed in claim 13, wherein the top surface is not covered by the protection layer, and the top surface includes a rough surface.

22. The light emitting diode chip as claimed in claim 13, wherein the supporting substrate comprises a conductive substrate.

23. The light emitting diode chip as claimed in claim 13, wherein the protection layer has an edge terminating at and directly contacting the supporting substrate.

24. The light emitting diode chip as claimed in claim 13, wherein the protection layer has an edge terminating at and directly contacting the supporting substrate and another edge terminating at the step profile.

\* \* \* \* \*